(12) United States Patent
Gnausch et al.

(10) Patent No.: US 11,480,495 B2
(45) Date of Patent: Oct. 25, 2022

(54) POSITION-TOLERANCE-INSENSITIVE CONTACTING MODULE FOR CONTACTING OPTOELECTRONIC CHIPS

(71) Applicant: JENOPTIK Optical Systems GmbH, Jena (DE)

(72) Inventors: Tobias Gnausch, Jena (DE); Robert Buettner, Jena (DE); Thomas Kaden, Dresden (DE); Thomas Juhasz, Weimar (DE); Armin Grundmann, Jena (DE); Thilo Von Freyhold, Weimar (DE)

(73) Assignee: JENOPTIK Optical Systems GmbH, Jena (DE)

( * ) Notice: Subject to any disclaimer, the term of this patent is extended or adjusted under 35 U.S.C. 154(b) by 386 days.

(21) Appl. No.: 16/636,572

(22) PCT Filed: Jul. 13, 2018

(86) PCT No.: PCT/DE2018/100642
§ 371 (c)(1),
(2) Date: Feb. 4, 2020

(87) PCT Pub. No.: WO2019/029765
PCT Pub. Date: Feb. 14, 2019

(65) Prior Publication Data
US 2020/0378865 A1    Dec. 3, 2020

(30) Foreign Application Priority Data

Aug. 7, 2017   (DE) .................... 10 2017 117 839.2
Sep. 11, 2017  (DE) .................... 10 2017 008 618.4
(Continued)

(51) Int. Cl.
*G01M 11/00* (2006.01)
*G01R 31/311* (2006.01)
*G01R 31/28* (2006.01)

(52) U.S. Cl.
CPC ........... *G01M 11/30* (2013.01); *G01R 31/311* (2013.01); *G01R 31/2889* (2013.01); *G01R 31/2891* (2013.01)

(58) Field of Classification Search
CPC ..... G01M 11/00; G01M 11/30; G01R 31/311; G01R 31/2889; G01R 31/2891;
(Continued)

(56) References Cited

U.S. PATENT DOCUMENTS 6,686,993 B1   2/2004  Karpman et al.
7,348,786 B2   3/2008  Thacker et al.
(Continued)

FOREIGN PATENT DOCUMENTS

EP   2813873 A1   12/2014
EP   2748956 B1    8/2018
WO   2005086786 A2  9/2005

OTHER PUBLICATIONS

International Search Report from PCT/DE2018/100642, filed Jul. 13, 2018, dated Oct. 29, 2018.
(Continued)

*Primary Examiner* — Jermele M Hollington
*Assistant Examiner* — Courtney G McDonnough
(74) *Attorney, Agent, or Firm* — Patentbar International PC

(57) ABSTRACT

The invention relates to a contacting module (1) by means of which the individual electrical and optical inputs and outputs ($A_{oC}$) of optoelectronic chips (2) are connected to the device-specific electrical and optical inputs and outputs of a test apparatus. It is characterized by a comparatively
(Continued)

high adjustment insensitivity of the optical contacts between the chips (2) and the contacting module (1), which is achieved, for example, by technical measures which result in the optical inputs ($E_{oK}$) of the chip (2) or on the contacting module (1) being irradiated in every possible adjustment position by the optical signal ($S_o$) to be coupled in.

12 Claims, 11 Drawing Sheets

(30) Foreign Application Priority Data

Oct. 24, 2017 (DE) .............. 10 2017 010 066.7
Mar. 8, 2018 (DE) .............. 10 2018 002 032.1

(58) Field of Classification Search
CPC .. H04B 10/801; H04B 10/803; G02B 6/4214; G02B 6/43
USPC .................................................. 356/73, 73.1
See application file for complete search history.

(56) References Cited

U.S. PATENT DOCUMENTS

| | | | |
|---|---|---|---|
| 7,554,347 B2 | 6/2009 | Mule' et al. | |
| 7,642,792 B2 | 1/2010 | Jager | |
| 8,742,782 B2 | 6/2014 | Ouyang et al. | |
| 9,040,896 B2 | 5/2015 | Walker | |
| 9,261,556 B2 | 2/2016 | McShane et al. | |
| 2004/0022488 A1* | 2/2004 | Coleman | G02B 6/4206 385/33 |
| 2004/0071398 A1* | 4/2004 | Pierce | G02B 6/421 385/28 |
| 2004/0101238 A1* | 5/2004 | Coleman | G02B 27/09 385/33 |
| 2005/0089276 A1* | 4/2005 | Yoon | G02B 6/43 385/39 |
| 2006/0249661 A1 | 11/2006 | Ishigami et al. | |
| 2008/0310852 A1 | 12/2008 | Tan et al. | |
| 2011/0279812 A1 | 11/2011 | Masuda | |
| 2014/0363153 A1 | 12/2014 | McShane et al. | |
| 2015/0295675 A1 | 10/2015 | Sugama | |
| 2017/0082799 A1 | 3/2017 | Novack et al. | |
| 2017/0199327 A1* | 7/2017 | Djordjevic | G02B 6/29331 |

OTHER PUBLICATIONS

D. Taillaert et al, Grating Couplers for Coupling between Optical Fibers and Nanophotonic Waveguides, Japanese Journal of Applied Physics, 2006, pp. 6071-6077, vol. 45, No. 8A.

J. De Coster et al, Test-station for flexible semi-automatic wafer-level silicon photonics testing, 2016 21th IEEE European Test Symposium (ETS), ISBN 978-1-4673-9659-2.

* cited by examiner

POSITION-TOLERANCE-INSENSITIVE CONTACTING MODULE FOR CONTACTING OPTOELECTRONIC CHIPS

RELATED APPLICATIONS

This application is a National Phase Application of International Application PCT/DE2018/100642, filed on Jul. 13, 2018, which in turn claims priority to German Patent Applications DE 10 2017 117 839.2, filed Aug. 7, 2017, DE 10 2017 008 618.4, filed Sep. 11, 2017, DE 10 2017 010 066.7, filed Oct. 24, 2017, DE 10 2018 002 032.1, filed Mar. 8, 2018, all of which are incorporated herein by reference in their entirety.

FIELD OF THE INVENTION

The invention relates to a contacting module for testing optoelectronic chips, as generically known from US 2006/0109015 A1.

The invention pertains to the field of testing and qualifying opto-electrically integrated circuits, known as PICs (photonic integrated circuits), at wafer level. In contrast to conventional, purely electrically integrated circuits, so-called ICs (integrated circuits), PICs integrate optical functionalities as well as electric circuits.

BACKGROUND OF THE INVENTION

In the manufacture of ICs, e.g. using CMOS technology, tests and measurements are carried out in various manufacturing steps in order to monitor the process on the one hand and to carry out quality control on the other. An established test is the electrical wafer level test after completion of the wafer. Here, functional and non-functional chips are identified and recorded in a wafer map, thereby determining the yield. Functional chips are also referred to as known good dies (KGD). When separating the wafer into individual chips, the non-functional chips are rejected. The test apparatus required for the wafer level test is available in the form of wafer probers and wafer testers with associated contacting modules (also called probe cards). The contacting module connects the interfaces (inputs and outputs) on the device side of the wafer tester with the individual interfaces (inputs and outputs) of the chips of the wafer fixed on the wafer prober. Basically, the contacting module can be designed in such a way that it contacts only one chip or several chips at the same time. It is also not absolutely necessary that the chips for contacting are still present as a compound of wafers. In order to contact several chips of a wafer simultaneously or one after the other, the chips merely need to have a fixed and defined position relative to each other. This margin is given for prior art contacting modules as well as for a contacting module according to the invention.

Test apparatuses for testing purely electronic chips (semiconductor chips with ICs) have been optimized and diversified over decades in order to be able to qualify high volumes of the most diverse ICs with high throughput for cost optimization.

PICs are usually manufactured using the same established semiconductor processes, e.g. CMOS technology. The very small production volumes of PICs compared to IC manufacture have led to the fact that, as a rule, only tests for process characterization, but no functional tests of the PICs were carried out in a semiconductor factory. Functional characterization is the end customer's responsibility and is often performed on sawn chips. The test apparatus used utilizes independent, separate electrical and optical contacting modules and is not optimized for throughput; in particular it does not allow parallel measurement of multiple PICs.

Testing PICs at the wafer level requires the coupling and uncoupling of light from the PIC level, usually by means of integrated grating couplers as coupling points, as described in the technical literature "Grating Couplers for Coupling between Optical Fibers and Nanophotonic Waveguides" (D. Taillaert et al, Japanese Journal of Applied Physics, Vol. 45, No. 8A, 2006, p. 6071-6077). Grating couplers can be functional components in the chip or sacrificial structures on the wafer, e.g. in the scribe lane or on adjacent chips.

According to the prior art, glass fiber-based systems are used for wafer level testing, as described in the technical literature: "Test-station for flexible semi-automatic wafer-level silicon photonics testing" (J. De Coster et al, 21th IEEE European Test Symposium, ETS 2016, Amsterdam, Netherlands, May 23-27, 2016. IEEE 2016, ISBN 978-1-4673-9659-2). These include a glass fiber-based optical module that couples light into and out of the coupling points of the chip via individual glass fibers. In order to ensure repeatable optical coupling, the glass fibers have to be adjusted with submicron accuracy to the coupling points at a distance of up to a few micrometers. This is only possible with the aid of high-precision actuators in combination with hexapods and piezo elements. On the other hand, a time-consuming, active adjustment sequence designed to achieve maximum coupling efficiency must be carried out before each individual optical coupling operation.

Existing wafer level test systems are thus characterized by
sequential, time-consuming contacting of all optical coupling points of a chip one after the other, i.e. parallel contacting of all optical coupling points of a chip is not possible or only possible to a very limited extent, and parallel contacting of several chips is not possible at all.

special solutions on the device side, so that conventional wafer probers can only be retrofitted with complex and cost-intensive modifications and can then no longer be used for the wafer level test of ICs, or only to a limited extent.

separate electronic and optical modules that are not permanently connected, i.e. both must be held and adjusted separately.

The aforementioned US 2006/0109015 A1 discloses an optoelectronic contacting module (probe module) for testing chips with electrical and optical inputs and outputs (device under—DUT 140), containing a contacting plate (probe substrate) and a redistribution plate (redistribution substrate). The contacting module constitutes an interface between a test apparatus (automated test equipment—ATE) and the DUT and is designed with electrical contacts (electrical probes), optical contacts (optical probes), optical elements and combinations thereof to conduct signals from the DUT and to the DUT and redistribute these signals for an interface to the test apparatus.

The separation into a contact plate and a redistribution plate results in a modular design of the contacting module, which has the advantage that if the contacts are damaged, the contacting plate can be replaced, while the redistribution plate can continue to be used with the comparatively expensive electrical and optical distribution network.

With regard to the optical inputs and outputs, it is disclosed that these are created via optical elements located on the contacting plate and/or the redistribution plate and matched to various coupling mechanisms, e.g. free radiation, quasi-free radiation or waveguides. Suitable optical elements mentioned include diffractive elements and refractive elements. It is also stated that a photodetector or a light source may be located directly at the interface to the DUT and then constitute the optical input or output on the contacting plate.

In addition, the aforementioned US 2006/0109015 A1 teaches that for optical coupling designs using free-beam or quasi-free beam connections, where the optical signal is guided through a free space between the optical element and the interface to the DUT, the optical signal is focused or collimated to achieve a high coupling efficiency of the transmitted signal. The signal coupling here is therefore subject to the concept of coupling the signal as completely as possible.

For signal transmission, it is proposed in an exemplary embodiment of the aforementioned US 2006/0109015 A1 to guide the optical signal from the side of the contacting plate facing the interface to the DUT through the contacting plate, redirect it to the rear surface thereof via an optical element and guide it to an optical receiver. Guiding through the contacting plate can be done by using a wavelength for the optical signal for which the contacting plate material is transparent, or by physically creating a path for the optical signal, e.g. through reflective metallized through-holes, optical dielectric, photonic crystal waveguides or optical fibers. Paths in the form of through-holes may also be filled with optically transparent material, e.g. a polymer.

According to another exemplary embodiment of the aforementioned US 2006/0109015 A1, the optical and electrical signal lines (optical and electrical distribution network) are embodied on separate redistribution plates. It is proposed to guide the electrical signals from the DUT to the edge regions of the contacting plate so that the electrical signals are coupled into the first redistribution plate above the contacting plate above the edge region. This allows an opening to be formed in the first redistribution plate, in which only the electrical signals are redistributed, through which opening the optical signals are guided into a separate second redistribution plate above.

In summary, the aforementioned US 2006/0109015 A1 presents a multitude of ideas on how a contacting module, which is divided into a contacting plate and a redistribution plate for a reason, e.g. due to wear of the mechanical contacts for electrical signal transmission, could be additionally equipped with optical signal lines. This completely ignores the fact that the tolerances possible for the mechanical contact of the electrical inputs and outputs of the contacting module to the DUT cannot be transferred to the optical inputs and outputs.

While the transmission of a constant electrical signal requires the mechanical contact of pins present on the contacting module with contact plates (contact pads) present on the DUT, which can be ensured within a comparatively large position tolerance of a few µm in all three spatial directions, the quality of the optical signal transmission is already influenced by a much smaller deviation, in the submicron range, from its target position.

If, as described in the aforementioned US 2006/0109015 A1, only the coupling efficiency of the optical signal is optimized by collimating or focusing the optical beam, the entire contacting module must be adjusted with high precision in the submicron range. Otherwise, the adjustment-dependent repeatability of the measurement is not sufficient for the applications described. This in turn means that the contacting module cannot exploit the typical adjustment tolerances in conventional electrical wafer probers for electrical contacting in the range of a few µm in the X, Y and Z directions. Complex and expensive special wafer prober solutions, i. a. with various actuators, such as piezo actuators, and linear axes or hexapods are required to adjust the contacting module to the DUT with high precision.

A further critical point is that for clean electrical adjustment of the pins a so-called overdrive of typically several 10 µm in the Z-direction is set, i.e. after initial contact of the pins with the electrical contact pads, the contacting module is moved by an additional amount in the Z-direction to ensure clean and reliable contacting. Wear and deformation of the pins are usually compensated by adjusting the overdrive during operation. In the case of a simple collimation or focusing of the optical beam, as described in the aforementioned US 2006/0109015 A1, the working distance in the Z-direction may only vary in the micrometer range for a precisely repeatable coupling. Thus, this type of optical coupling is not compatible with established electrical contacting methods.

In addition, the aforementioned US 2006/0109015 A1 only describes the transmission of the optical signal on the surface of the contacting plate (probe substrate) either on the front or on the back.

An optical signal that is only guided on the front must either be converted into an electrical signal by additional elements (photodiodes) and then guided to the back by means of e.g. an electrical through connection, or directly decoupled, e.g. by means of fibers on the front surface. There is hardly any space for either of this between the contacting module and the DUT, due to the space available as a result of the advantageous short working distance between the contacting module and the DUT of typically a few 10 µm to a few 100 µm. The smaller the working distance, the higher the efficiency of the optical coupling and the fewer tolerances impact the optical coupling at the same time.

In addition, it is expedient to use existing technologies for electrical contacting, such as so-called electronic cantilever, vertical and MEMS probe cards. These usually also have a small distance to the DUT and little free space between the probe card and the DUT.

An optical signal guided on the rear surface inevitably has a very high optical working distance, greater than the substrate thickness of the contacting module, and thus the disadvantages already described above. Moreover, it also requires space on the rear surface of the contacting plate (probe substrate), either for contacting with fibers or additional elements for conversion into an electrical signal. This installation space is not available, for example, when using vertical probe cards for electrical contacting.

SUMMARY OF THE INVENTION

The object of the invention is to create a position-tolerance-insensitive optoelectronic contacting module for contacting an optoelectronic chip.

For a contacting module for the successive contacting of optoelectronic chips for the purpose of transmitting electrical and optical signals between in each case at least one of the optoelectronic chips and the contacting module, wherein the successively contacted optoelectronic chips and the contacting module are arranged in different adjustment positions relative to one another due to tolerances, with electrical and optical signal lines arranged in the contacting module, which each have an electrical or optical input or output, which as electrical or optical inputs or outputs on the contacting module are each assigned to an electrical or optical input or output of the at least one optoelectronic chip, wherein the electrical inputs and outputs on the contacting module are each formed by contact pins which, for transmitting the electrical signals, are each in mechanical contact, in each of the adjustment positions, with one of the electrical inputs or outputs of the at least one optoelectronic chip, which are each formed by an electrical contact plate and the optical inputs and outputs on the contacting module with the optical inputs and outputs of the at least one optoelectronic chip delimit, in respective pairs, a free beam optical region for transmitting the optical signals, this object is achieved in that the optical signals transmitted from the contacting module to the at least one optoelectronic chip irradiate the optical inputs of the at least one optoelectronic chip in each of the adjustment positions, and in that the optical inputs on the contacting module are irradiated by the optical signals transmitted by the at least one optoelectronic chip in each of the adjustment positions or the optical signals transmitted by the at least one optoelectronic chip are completely coupled into the optical inputs on the contacting module in each of the adjustment positions.

Advantageously, the contacting module includes an electronic module with a printed circuit board, in which the electrical signal lines are guided, and an optical module with an optical block, in which the optical and/or electrical signal lines are guided, which lead to the optical inputs and outputs on the contacting module, with the printed circuit board and the optical block being fixedly arranged in a mutually adjusted manner.

Preferably, the printed circuit board and the optical block are made of different materials so that different technologies can be used independently of each other to produce the electrical and optical signal lines.

Advantageously, the optical signal lines are waveguides integrated in the optical block.

It is further advantageous if at least one of the optical inputs on the contacting module is formed by a light-sensitive surface of a photodiode which is larger than the incident beam cross-section of the optical signal, so that the optical signal is completely incident on the light-sensitive surface in each of the adjustment positions and the photodiode converts the optical signal into an electrical signal and transmits it via one of the electrical signal lines.

Preferably, the free beam region, in each case, is embodied such that the optical signal illuminates an area of the optical input on the contacting module or the chip larger than the opening of the optical input on the contacting module or the at least one chip, so that the respective optical input is irradiated in each of the adjustment positions.

Advantageously, the inputs or outputs of the waveguides, which form the optical inputs or outputs on the contacting module, are located inside the optical block and each of the inputs or outputs is preceded by an integrated mirror which deflects the optical signals coming from the at least one chip and freely radiated into the optical block towards the waveguide or deflects the optical signals coming from the waveguide in a direction required for coupling into the at least one chip.

Preferably, the intensity distribution in the beam cross-section of the optical signal corresponds to a Gaussian distribution.

Advantageously, the intensity distribution in the beam cross-section of the optical signal corresponds to a top-hat distribution.

Preferably, the waveguides each end in a taper, which has a cross-section adapted to a waveguide cross-section at the input of the waveguide and directs the entire radiation intensity of the optical signal completely into the waveguide in each of the adjustment positions, the beam cross-section of the optical signal incident in the taper being smaller than an entrance opening of the taper.

Advantageously, the mirror is designed as a concave mirror.

Preferably, the waveguides each end in an upstream waveguide group, whose ends together form one of the optical inputs, which is completely irradiated in each adjustment position, so that a larger proportion of the signal intensity is coupled in than into just one waveguide.

Furthermore, it is advantageous if there is at least one beam shaping element in the free beam region to shape the optical signal geometrically and/or in its intensity distribution.

Preferably, the beam shaping element is a structured gray grad filter that homogenizes the intensity distribution of the optical signal.

BRIEF DESCRIPTION OF THE DRAWINGS

The invention will be explained in more detail below with reference to exemplary embodiments and drawings. In the drawings.

DETAILED DESCRIPTION OF THE PREFERRED EMBODIMENTS

Figure 1:
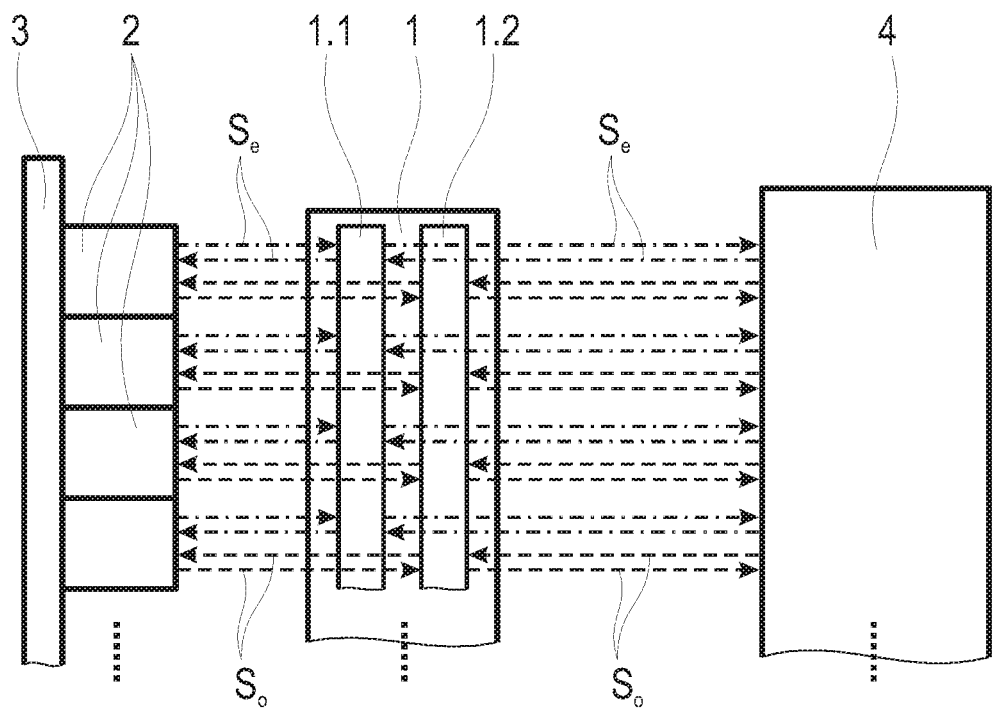
FIG. 1 shows a first block diagram for the signal transmission between some chips of a wafer and the test apparatus via a contacting module.

Similar to contacting modules known from the prior art, a contacting module 1 according to the invention is arranged between a wafer platform 3, e.g. a wafer prober, on which a wafer with optoelectronic chips 2 to be tested is fixed, and a test apparatus 4 for generating and evaluating optical signals $S_o$ and electrical signals $S_e$, as shown in FIG. 1 in a block diagram. The contacting module 1 establishes the signal-related connection between the individual interfaces of the one or more optoelectronic chips 2 to be tested simultaneously (hereinafter referred to, for simplification of the description, as a chip 2) and the specified device-related interfaces of the test apparatus 4. The interfaces are, respectively, electrical or optical inputs and outputs from or to which the electrical or optical signals $S_e$, $S_o$ are input or output and are transmitted to or from them, respectively, via electrical or optical signal lines 1.1.1.1, 1.2.1.1

The contacting module 1 is connected via electrical interfaces to the test apparatus 4 in a manner known from the prior art, preferably using plug-in connections. Optical interfaces with the test apparatus 4 are preferably realized via glass fiber connections with associated fiber or multifiber connectors.

For contacting the interfaces of the chip 2, the contacting module 1 and the wafer platform 3 are adjusted with respect to each other. In doing so, tolerances may require different adjustment positions to be taken up for successive contacting of the chips 2. The adjustment accuracy required for the optoelectronic test of the chip 2 depends on the tolerance limits within which reliable contacting of the interfaces, i.e. repeatable signal transmission, can still be guaranteed.

Similar to the prior art, the electrical inputs and outputs $E_{eK}$, $A_{eK}$ on the contacting module 1 are each formed by contact pins 1.1.2 which, for transmitting the electrical signals $S_e$, are each in mechanical contact with one of the electrical inputs or outputs $E_{eC}$, $A_{eC}$ of the at least one optoelectronic chip 2, which are each formed by an electrical contact plate 2.1. As explained in detail in the description of the prior art, the tolerance limits required for reliable electrical contacting are large compared to the tolerances required for optical contacting.

The optical inputs and outputs $E_{oK}$, $A_{oK}$ on the contacting module 1 and the optical inputs and outputs $E_{oC}$, $A_{oC}$ of the optoelectronic chip 2 together delimit, in respective pairs, a free beam region, as it is called herein, for the transmission of the optical signals $S_o$. A free beam region is understood to be a region along which an optical signal $S_o$, including an optical beam, is not guided in an optical signal guide, especially in a waveguide. In this case, the beam can be guided completely uninfluenced only in air as a medium over the distance between the chip 2 and the contacting module 1 or additionally in the medium of the contacting module 1, if its optical inputs or outputs $E_{oK}$, $A_{oK}$ are not located directly on an outer surface of the contacting module 1. In this free beam region, as it is called herein, beam shaping and beam deflection elements can be provided on the contacting module 1 in order to direct the beam entering the contacting module 1 to the waveguide input and/or to shape the beam geometrically or in its intensity distribution and to prepare the beam emerging from the contacting module 1 for coupling into the chip 2.

In order to ensure a repeatable transmission of the optical signals $S_o$, i.e. the signal intensity coupled into the optical inputs $E_{oC}$, $E_{oK}$ of the chip 2 and on the contacting module 1 does not exceed a predetermined range of fluctuation, various alternative measures are taken, according to the invention, for the embodiment of the free beam region, including the optical inputs and outputs $E_{oK}$, $A_{oK}$ on the contacting module 1, which are described in various exemplary embodiments for a contacting module 1 according to the invention.

In all exemplary embodiments, either the optical outputs $A_{oK}$ on the contacting module 1 are arranged with respect to the respective optical inputs $E_{oC}$ of the optoelectronic chip 2 in such a way that, due to the length of the respective free beam region formed, the optical inputs $E_{oC}$ of the optoelectronic chip 2 are irradiated by the optical signals $S_o$ in each of the adjustment positions, which is possible with an at least slightly divergent radiation of the optical signal $S_o$, and/or there are optical means at or between the optical outputs $A_{oK}$ on the contacting module 1 and the optical inputs $E_{oC}$ of the optoelectronic chip 2 in the respective free beam region, which optical means form the optical signal $S_o$, so that the optical inputs $E_{oC}$ at the chip 2 are irradiated by the optical signals $S_o$ in each of the adjustment positions.

Moreover, all or some of the optical inputs $E_{oK}$ on the contacting module 1 are arranged with respect to the respective optical outputs $A_{oC}$ of the optoelectronic chip 2 in such a way that, due to the length of the respective free beam region formed, the optical inputs $E_{oK}$ on the contacting module 1 are irradiated by the optical signals $S_o$ in each of the adjustment positions, and/or there are optical means at or between the optical outputs $A_{oC}$ of the chip 2 and the optical inputs $E_{oK}$ on the contacting module 1 in the respective free beam region, which optical means form the optical signal $S_o$, so that the optical inputs $E_{oK}$ on the contacting module 1 are irradiated by the optical signals $S_o$ in each of the adjustment positions.

Alternatively, all or some of the optical inputs $E_{oK}$ on the contacting module 1 are arranged with respect to the respective optical outputs $A_{oC}$ of the optoelectronic chip 2 in such a way that, due to the length of the respective free beam region formed, the optical inputs $E_{oK}$ on the contacting module 1 are irradiated by the optical signals $S_o$ in each of the adjustment positions, and/or there are optical means at or between the optical outputs $A_{oC}$ of the chip 2 and the optical inputs $E_{oK}$ on the contacting module 1 in the respective free beam region, which optical means form the optical signal $S_o$, so that the optical signals $S_o$ transmitted by the optoelectronic chip 2 are fully coupled into the optical inputs $E_{oK}$ on the contacting module 1 in each of the adjustment positions.

For the purposes of this description, beam shaping means (beam shaping elements) refers to any element affecting the geometric beam shape or the intensity distribution within a beam.

The contacting module 1 may presently consist of one or more components arranged in a defined manner with respect to each other. It may also be a monolithic component on which the electrical and optical inputs and outputs $E_{eK}$, $E_{oK}$, $A_{eK}$, $A_{oK}$ are arranged facing the chip 2 for contacting the chip 2, with each of these inputs and outputs leading, via an electrical or optical signal line 1.1.1.1, 1.2.1.1 in the form of a distribution network, to inputs and outputs which are connected to the interfaces of the test apparatus 4. Also similar to the prior art, the contacting module 1 may presently contain a contact plate for optical and electrical contacting of the chip 2 and one or more distribution plates for signal distribution. Other embodiments are conceivable in which the inputs and outputs $E_{eK}$, $E_{oK}$, $A_{eK}$, $A_{oK}$ on the contacting module 1 are embodied according to the invention.

Particularly advantageously, the contacting module 1 includes an electronic module 1.1 with a printed circuit board 1.1.1, which preferably corresponds to a cantilever or vertical probe card known from the prior art and on which the electrical inputs and outputs $E_{eK}$, $A_{eK}$ are arranged, and an optical module 1.2, with an optical block 1.2.1, on which the optical inputs and outputs $E_{oK}$, $A_{oK}$ are arranged, which are formed here by the inputs and outputs of waveguides integrated in the optical block 1.2.1 and forming the optical signal lines 1.2.1.1, or in a special case by the light-sensitive surface 6.1 of a photodiode 6.

The electrical signal lines 1.1.1.1 as well as the electrical inputs and outputs $E_{eK}$, $A_{eK}$ on the contacting module 1 and the optical signal lines 1.2.1.1 with their optical inputs and outputs $E_{oK}$, $A_{oK}$ can thus be produced independently of each other by different manufacturing processes. To ensure that all inputs and outputs, whether optical or electrical, form a common arrangement that can be adjusted relative to the chip 2 under test, the printed circuit board 1.1.1 and the optical block 1.2.1 are fixed in a manner adjusted to each other.

The optical block 1.2.1 is preferably monolithic and is made of a different material than the printed circuit board 1.1.1, namely a material suitable for the production of optical signal lines 1.2.1.1 in the form of integrated waveguides. For the production of the optical signal lines 1.2.1.1 in the optical block 1.2.1, in the form of waveguides, technologies can be used which allow them to be manufactured very precisely with only small mutual tolerances. These include laser-based direct writing methods. On the one hand, by changing the optical properties of the substrate material of the optical block 1.2.1, these allow the introduction of waveguides and, on the other hand, by locally changing the structure of the substrate material, a local modification of the wet chemical etching behaviour of the substrate material and thus the creation of optical elements, such as mirrors, by subsequent etching directly into a substrate material of glass with submicron precision. The position and shape of the elements thus created can be flexibly adapted directly by varying the writing parameters of the laser.

Figure 2:
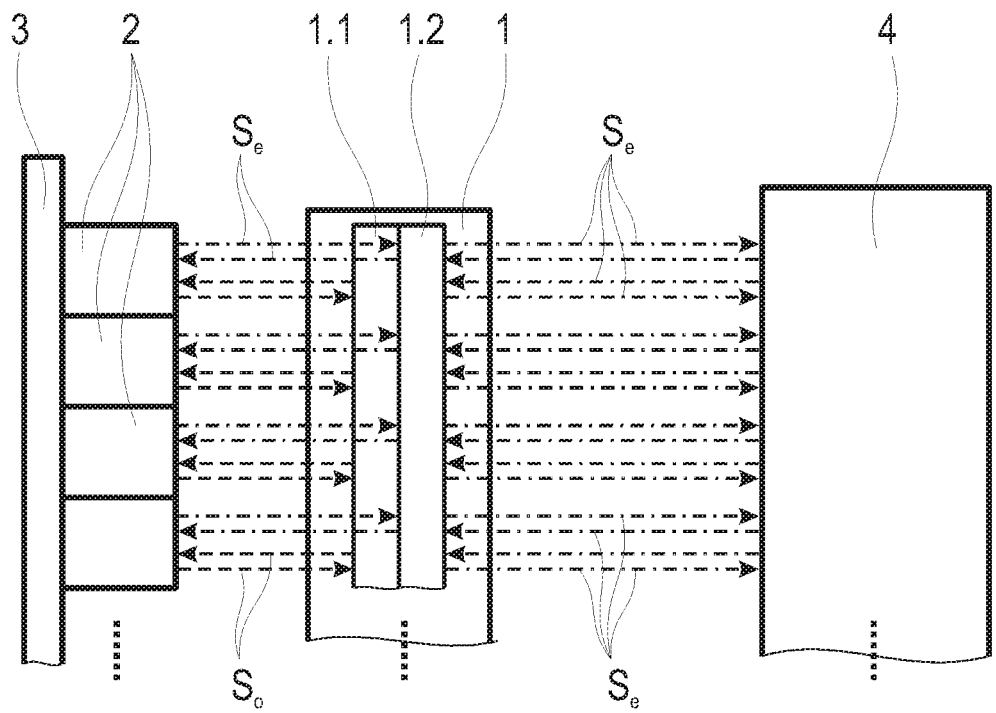
FIG. 2 shows a second block diagram for the signal transmission between some chips of a wafer and the test apparatus.

In contrast to the contacting module 1 according to FIG. 1, whose concept is to transmit the optical signals $S_o$ (dashed line) to the test apparatus 4, the concept of a contacting module 1 according to FIG. 2 is to convert optical signals $S_o$ coming from the chip 2 into electrical signals $S_e$ (dashed/dotted line) which are transmitted to the test apparatus 4. The optical inputs $E_{oK}$ on the contacting module 1 are then advantageously formed by an optical receiver. It is advantageous that in this case only electrical signals $S_e$ have to be guided to the test apparatus 4, which reduces the effort required to adapt a conventional test apparatus 4 for testing purely electronic chips to the task of testing optoelectronic chips 2.

In an advantageous embodiment of the contacting module 1 comprising an electronic module 1.1 and an optical module 1.2 with the optical block 1.2.1, the optical block 1.2.1 is advantageously embodied in its dimension and geometry, including breakthroughs and/or openings, in such a way that all contact pins 1.1.2 present on the electronic module 1.1 can be in contact with the chip 2 past the optical block 1.2.1, around it and/or if necessary through openings formed therein. This enables the integration of all optical interfaces in one monolithic block.

Once the physical contacts are established at the electrical interfaces, the optical block 1.2.1 is only a small defined distance away from the chip 2.

Figure 3A:
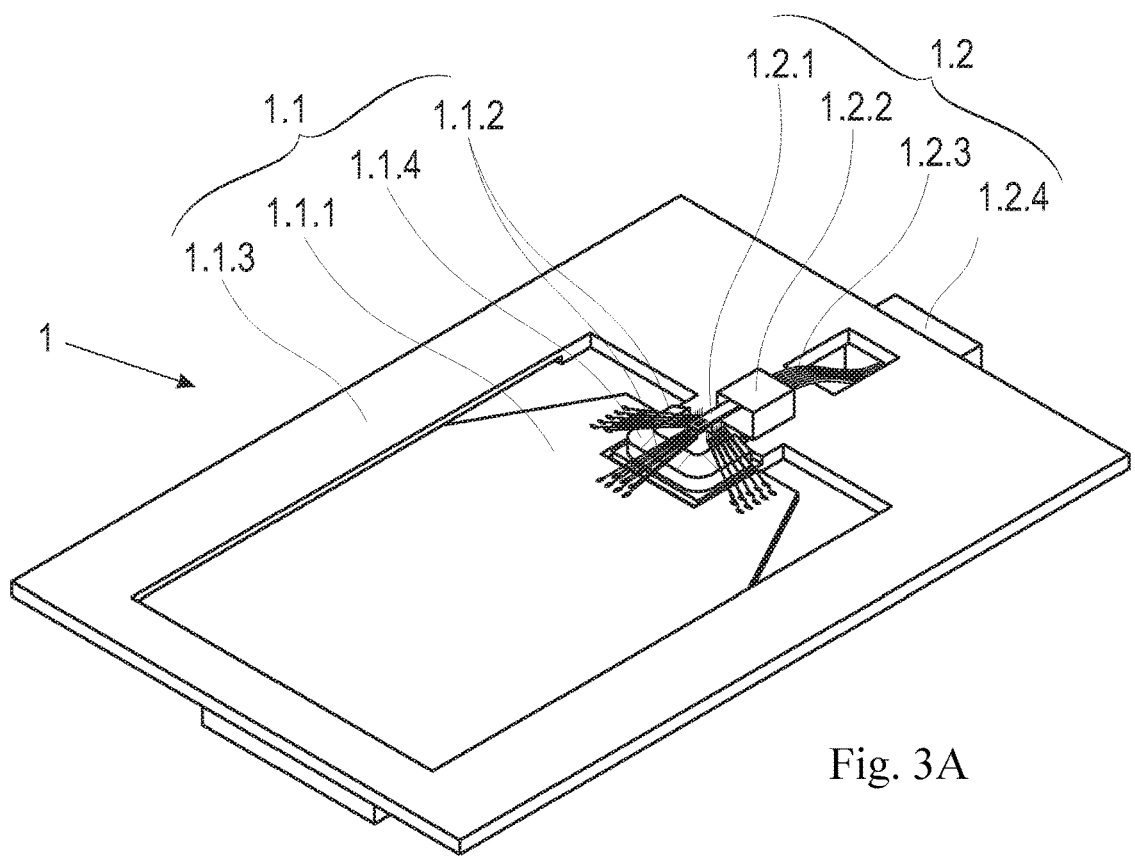
FIGS. 3A-3B show a first exemplary embodiment of a contacting module, configured to contact a single chip.
Figure 3B:
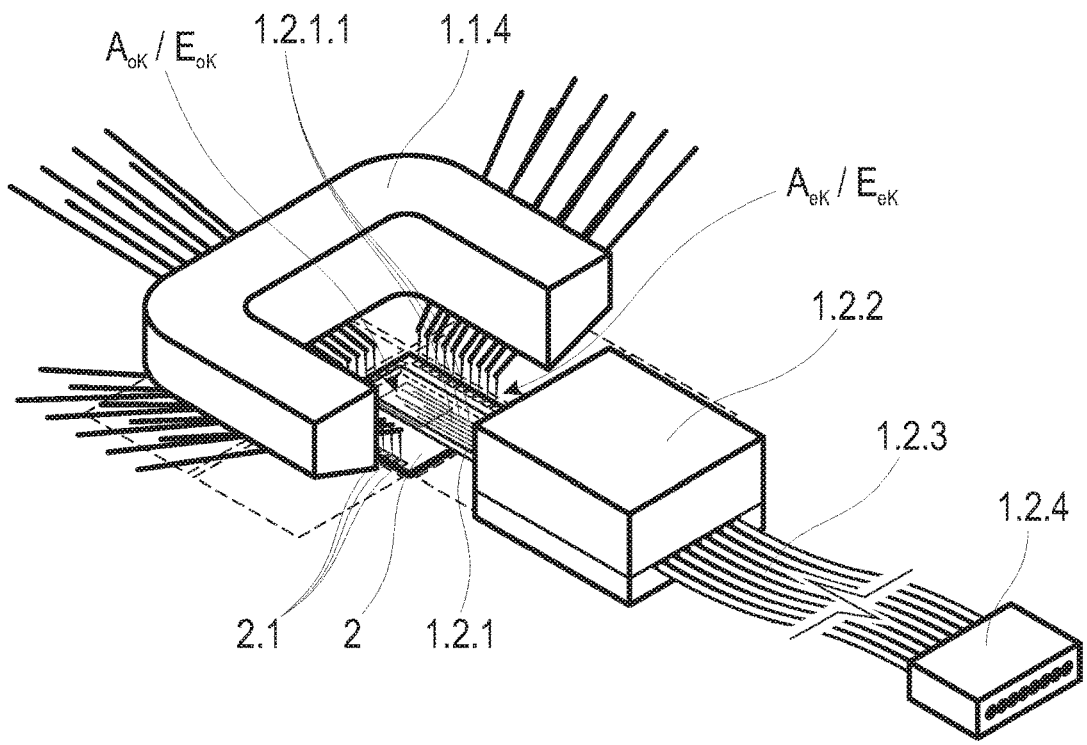

A first exemplary embodiment of a contacting module 1 is shown in FIG. 3A and in FIG. 3B.

The contacting module 1 includes an electronic module 1.1 and an optical module 1.2. The electronic module 1.1 corresponds in its technical design to a conventional contacting module for purely electronic chips. It includes a printed circuit board 1.1.1, contact pins 1.1.2, designed here as cantilever pins by way of example, and a carrier plate 1.1.3 assigned to the printed circuit board 1.1.1. The electrical contact is established via the electronic module 1.1 by physical contact of the contact pins 1.1.2 with the electrical contact plates 2.1 of the chip 2.

The optical module 1.2 consists of an optical block 1.2.1 with optical signal lines 1.2.1.1, each in the form of a waveguide, or in a special case also in the form of several waveguides, which are combined within the optical block 1.2.1 to form one waveguide, and an integrated mirror 1.2.1.2 in front of each waveguide (see e.g. FIG. 4), a fiber holder 1.2.2 with V-grooves, as well as glass fibers 1.2.3 and single-fiber connectors or a multi-fiber connector 1.2.4. The waveguides 1.2.1.1 are manufactured by a laser direct writing process and the mirrors 1.2.1.2 by a laser assisted etching process. Consequently, the waveguides are formed as a result of the input of laser energy by localized modified substrate material, which is characterized in particular by a local refractive index modification compared to the refractive index of the substrate material. The mirrors 1.2.1.2 are formed by interfaces of etched recesses in the substrate material. The substrate material of the optical block 1.2.1 is glass, preferably borofloat glass, and has a thickness in the range of several 100 µm to several millimetres, preferably 0.5-1 mm. The optical contacting/coupling takes place without direct contact with the chip 2 over a distance between the chip 2 and the contacting module 1. The optical fibers 1.2.3 and waveguides 1.2.1.1 can be designed for both monomode and multi-mode operation and for the wavelength range from visible light to the IR range. The preferred embodiment is monomode operation in the wavelength range of the O to L band. Without additional beam shaping elements in the beam path at or between the optical inputs and outputs, the optical signals $S_o$ guided in the waveguides 1.2.1.1 in the optical block 1.2.1.1 are coupled in each case via a mirror 1.2.1.2 at one of the optical outputs $A_{oK}$ of the optical module into an optical input $E_{oC}$ of the chip 2 with a Gaussian mode profile in the beam cross section of the optical signal $S_o$. The working distance between the contacting module 1 and the chip 2 is typically a few 10 µm to several 100 µm. In a preferred variant, the working distance is deliberately chosen so that the beam cross-section illuminates a much larger area than the size of the aperture of the optical input $E_{oC}$, which here is equated to the mode diameter of the grating coupler, which is present at the optical input $E_{oC}$ for coupling the optical signal $S_o$. Due to the larger illuminated area, i.e. the optical input $E_{oC}$ is irradiated, the coupling efficiency is reduced, but the adjustment sensitivity is also reduced. This allows a higher repeatability of the measurements for a given adjustment accuracy and leads to only a small fluctuation range of the coupled signal intensity. For example, a preferred working distance is 100 µm. The coupling is therefore optimized not so much for efficiency, but primarily for a maximum reduction in adjustment sensitivity.

The optical signals $S_o$ coming from the test apparatus 4 are coupled into the glass fibers 1.2.3 and then laterally into the waveguides 1.2.1.1 of the optical block 1.2.1 by means of fiber or multifiber connectors. The connecting surfaces between the fiber holder 1.2.2 and the optical block 1.2.1 are chamfered (not shown), e.g. at an angle of 8° to the perpendicular to the direction of the glass fibers 1.2.3, to avoid back reflections. The vertical coupling to the chip 2 is achieved by means of the mirrors 1.2.1.2, which are each present (not shown in FIGS. 3a and 3b) at the ends of the waveguides in the optical block 1.2.1. In a preferred variant the mirrors 1.2.1.2 work in total reflection.

The side of the fiber holder 1.2.2 facing the chip 2 does not protrude beyond the side of the optical block 1.2.1 facing the chip 2. This is important because of the small working distance to avoid a collision of the optical module 1.2 with the chip 2 during contacting.

The method used to manufacture the mirrors 1.2.1.2 and the waveguides allows all mirrors 1.2.1.2 and waveguides 1.2.1.1 and thus the optical interfaces within an optical block 1.2.1 made of a substrate to be positioned relative to each other with sub-micron precision;

the free positioning of the mirrors 1.2.1.2 and the waveguides within the substrate;

distances (pitches) of the mirrors 1.2.1.2 and thus distances of the optical outputs and inputs of 250 µm, 127 µm and less;

by adjusting the mirror angle an adjustment of the beam angle to the different angles of radiation of the optical signal $S_o$ on optical coupling elements arranged at the optical inputs $E_{oC}$ of the chip 2, e.g. a grating coupler with a radiation profile of typically 8-20°);

a fast, flexible and cost-effective change of the position of the optical interfaces for contacting modules 1 adapted to other chips 2.

The electronic module 1.1 includes a printed circuit board 1.1.1, a carrier plate 1.1.3, a ceramic support 1.1.4 and contact pins 1.1.2 glued to it, in this case cantilever pins. The optical module 1.2 is glued to the electronic module 1.1, preferably via e.g. three fixing points on the carrier plate 1.1.3, which is advantageously a metal frame. Basically the optical block 1.2.1 can also be attached directly to the printed circuit board 1.1.1. The attachment of the optical module 1.2 to the carrier plate 1.1.3, to which the printed circuit board 1.1.1 is also attached, is advantageous for the following reason:

In order to achieve a defined optical working distance of the optical module 1.2 to the chip 2 with simultaneous reliable electrical contacting by the contact pins 1.1.2, the contact pins 1.1.2 and the optical block 1.2.1 of the optical module 1.2 must be aligned very precisely to each other in the Z direction. In addition, an at the most slight deformation of the contacting module 1 should take place under mechanical load of the contacting module 1 by the contact pressure of the contact pins 1.1.2. Both of these aspects are ensured by the use of a metal frame to support the printed circuit board 1.1.1 and to fix the optical block 1.2.1.

When manufacturing the electronic module 1.1, e.g. with cantilever pins as the contact pins 1.1.2, the Z-height of the pins is usually referenced to the clamping points of contacting module 1 with a fixed reference to the wafer platform 3. With a metal frame as the carrier plate 1.1.3, these reference points are located on the metal frame into which the fixing points for the optical module 1.2 are integrated with high precision. Thus, the optical module 1.2 can be mounted exactly plane-parallel and precisely in relation to the reference plane of the tips of the contact pins 1.1.2 by positionally accurate gluing to the fixing points in the Z-direction. Plane-parallel mounting of the optical module 1.2 to the electronic module 1.1 also prevents the optical module 1.2 from colliding with the chip 2 in operation, during contacting, due to the small working distance.

The first exemplary embodiment of a contacting module 1 according to FIGS. 3A and 3B enables the electrical contacting of exactly one chip 2 by means of the electronic module 1.1 on three sides in the edge region of the chip 2. The fourth side in the edge region of the chip 2 is used as access for the optical module 1.2.

Figure 4:
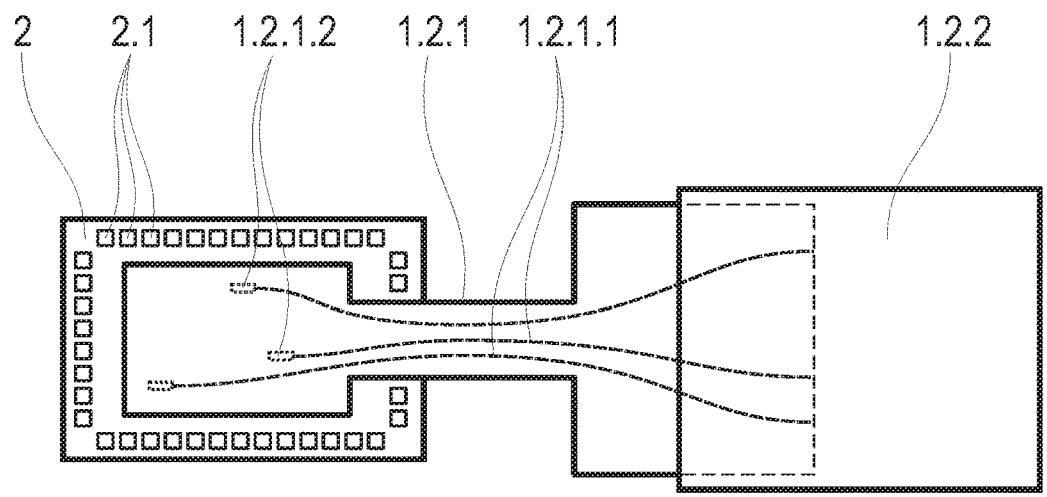
FIG. 4 shows a second exemplary embodiment of a contacting module.

In a second exemplary embodiment, shown in FIG. 4, the shape of the optical block 1.2.1 and the routing of the optical signal lines 1.2.1.1, in the form of integrated waveguides, are adapted to a layout configuration of the optical and electrical interfaces of the chip 2, in which the electrical interfaces are arranged on all sides in the edge region of the chip 2 and the optical interfaces are arranged in a central area. The illustration in FIG. 4 is merely an example of the flexible routing of the waveguides in the optical block 1.2.1 while maintaining negligible positional tolerances of the waveguides and mirrors 1.2.1.2 to each other.

In the first and second exemplary embodiments of a contacting module 1, according to FIGS. 3A, 3B and 4, the optical signals $S_o$ coming from the chip 2 are coupled into the optical signal lines 1.2.1.1, in the form of waveguides, after they have each been freely irradiated into the optical block 1.2.1 and deflected via a mirror 1.2.1.2 towards one of the waveguides. The signals emerging from the waveguides are accordingly each guided freely through the optical block 1.2.1 and deflected towards the chip 2 via a mirror 1.2.1.2 and coupled into the optical inputs $E_{oC}$ of the chip 2. Different embodiments of the free beam path will be explained later with reference to FIGS. 6A-D and FIGS. 7-14.

Figure 5A:
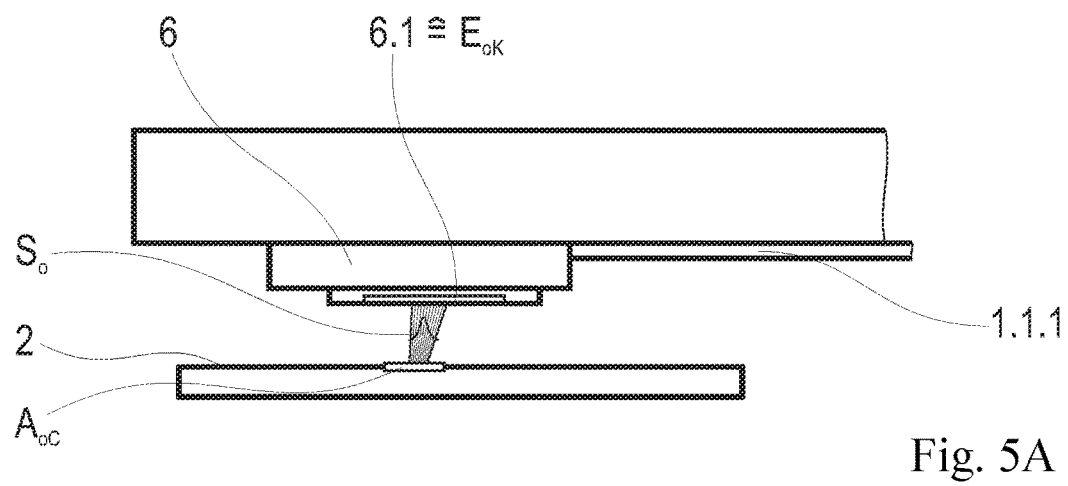
FIGS. 5A-5B show the coupling of an optical signal into the optical module via a photodiode in two different adjustment positions.
Figure 5B:
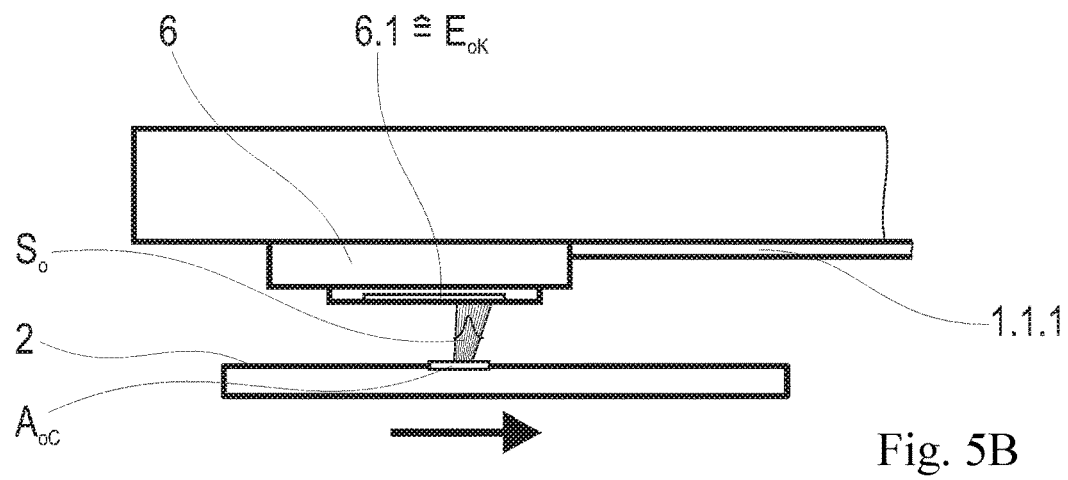

Alternatively, the coupling of the optical signals $S_o$ into the signal lines of the optical module 1.2 according to a third exemplary embodiment, as shown in FIGS. 5A-B, can also be carried out via photodiodes 6, whose light-sensitive surfaces 6.1 then constitute optical inputs $E_{oK}$ of the signal lines in the optical module 1.2 in the sense of this description. In this special case the optical inputs $E_{oK}$ in the optical module 1.2 are connected in the broadest sense with electrical signal lines 1.1.1.1. It is decisive in this context that the working distance of the chip 2 to the photodiodes 6 and the size of the light-sensitive surface 6.1 of the photodiodes 6 are combined to achieve the desired adjustment insensitivity. This is the case if the light-sensitive surface 6.1 of the photodiodes 6 is large enough at the selected working distance that at each tolerance-related adjustment position of the chip 2 with respect to the contacting module 1, two of which are shown in FIGS. 5A-5B, the intensity of the optical signal $S_o$ detected by the photodiode 6 only leads to a change that is tolerable for the measurement.

Figure 5C:
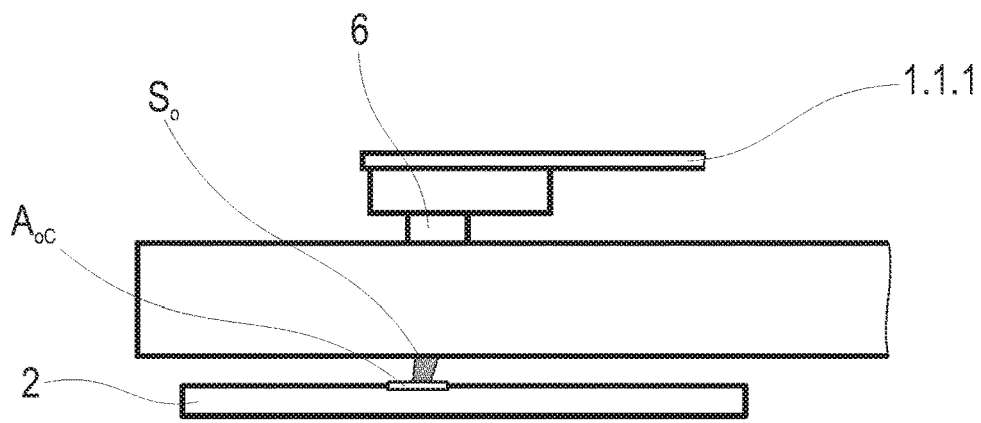
FIGS. 5C-5E show three possible mounting positions of a photodiode in the optical module.
Figure 5D:
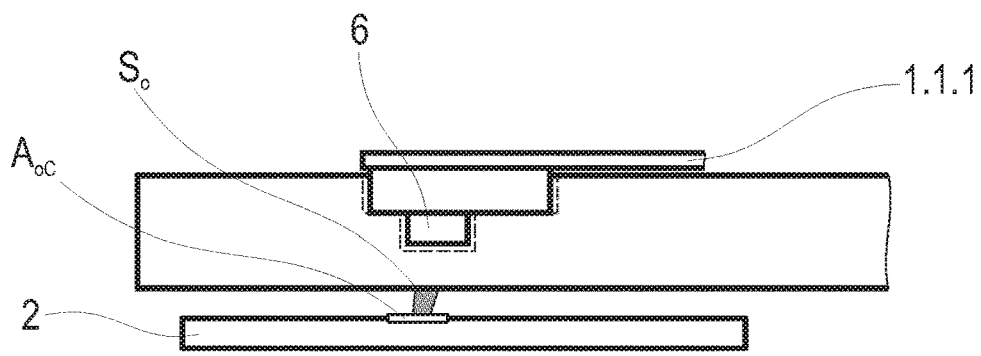
Figure 5E:
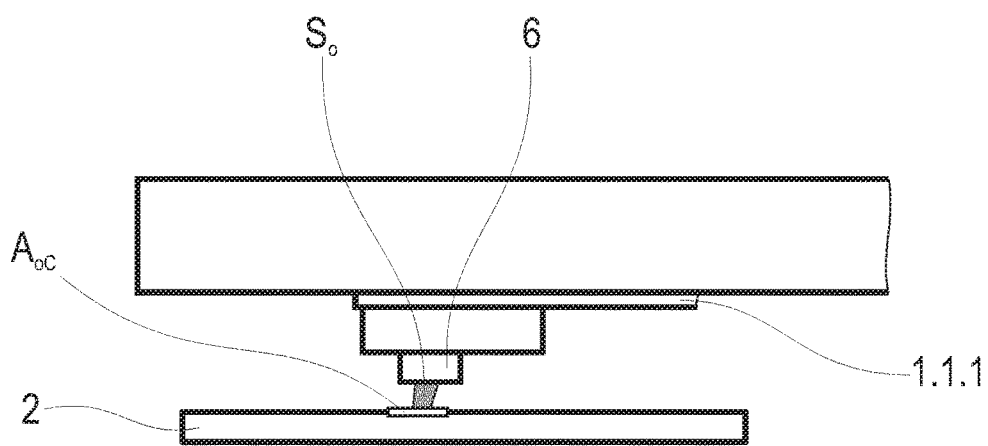

Preferably, the distance between the photodiodes 6 and the chip 2 is chosen as small as possible in order to achieve both high efficiency and maximum adjustment insensitivity. However, in order to be able to vary the working distance for the coupling out from the chip 2 (minimum length of the optical free beam region between the optical output $A_{oC}$ of the chip 2 and the optical input $E_{oK}$ on the contacting module 1) independently of the working distance required for the coupling into the chip 2 (minimum length of the optical free beam region between the optical output $A_{oK}$ on the contacting module 1 and the optical input $E_{oC}$ of the chip 2), FIGS. 5C-E show three generally possible mounting positions of one of the photodiodes 6 in the optical module 1.2 on the upper surface, in a recess formed on the upper or lower surface and on the lower surface.

The contacting of the photodiodes 6 can be done e.g. by means of flip chip soldering or bonding directly on an electrical cable, e.g. flex cable, or using a ceramic holder for additional redistribution and stabilization. Another alternative is to mount the photodiodes 6 directly on the optical block 1.2.1. The flex cable can be positioned directly next to it and e.g. glued, a contact being made by bonding. Preferably, high-speed InGaAs/InP photodiodes commonly used in telecommunications are used for the wavelength range of the O to L band. Their sensitivity is very homogeneous over the entire diode surface.

In the following, further exemplary embodiments, which can be optionally combined with the above mentioned ones, will show different measures by which the optical signal $S_o$ is influenced in such a way that it can be coupled into the optical input of the waveguide without adjustment sensitivity.

In a first group of exemplary embodiments, a reduced optical adjustment sensitivity with sufficient efficiency, at the same time, in the optical coupling of the optical signals $S_o$ is made possible without the need for additional beam shaping elements to optimize the beam cross-section and/or beam profile (intensity distribution over the beam cross-section).

In addition to a basic configuration for reducing the adjustment sensitivity when coupling an optical signal $S_o$ coming from the chip 2 into the contacting module 1, FIGS. 6A-6D show three variants in which the inputs of the waveguides, as optical inputs $E_{oK}$ on the contacting module 1, are specially designed to increase the coupled intensity of the signal.

Figure 6A:
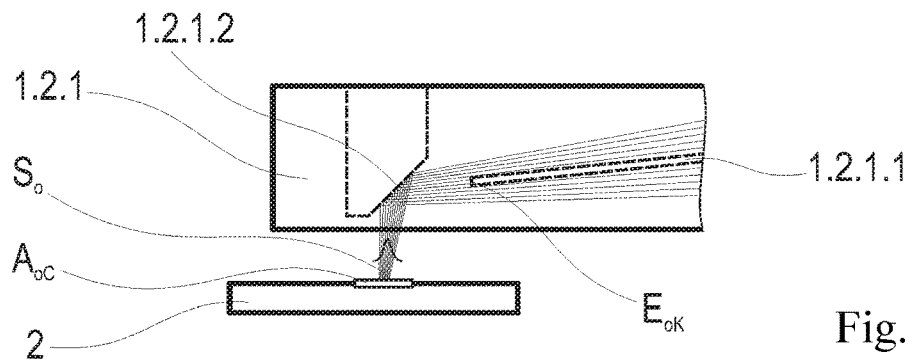
FIGS. 6A-6D show differently designed inputs of waveguides in the optical module.

Variant a), in FIG. 6A, shows a basic configuration without additional optimization, as already explained with reference to a previously described exemplary embodiment. The optical signal $S_o$ is emitted from an optical output $A_{oC}$ of the chip 2, in which a coupling element, e.g. a grating coupler, is arranged, at an angle, i.e. in a diverging manner, impinges on the mirror 1.2.1.2 and is detected by the input of the waveguide 1.2.1.1 with low efficiency, since the waveguide cross-section covers only a fraction of the incoming beam cross-section, which irradiates the input of the waveguide in any adjustment position.

Figure 6B:
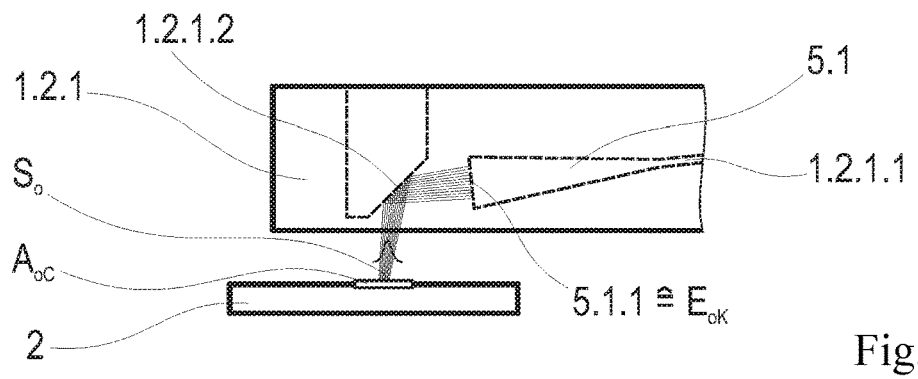

Variant b), in FIG. 6B, shows a taper 5.1, which has a cross-section adapted to the waveguide cross-section at the entrance of the waveguide and directs the entire radiation intensity of the optical signal $S_o$ completely into the waveguide in any adjustment position, if the beam cross-section of the optical signal $S_o$ entering the taper 5.1 is correspondingly smaller than the entrance opening 5.1.1 of the taper 5.1.

Figure 6C:
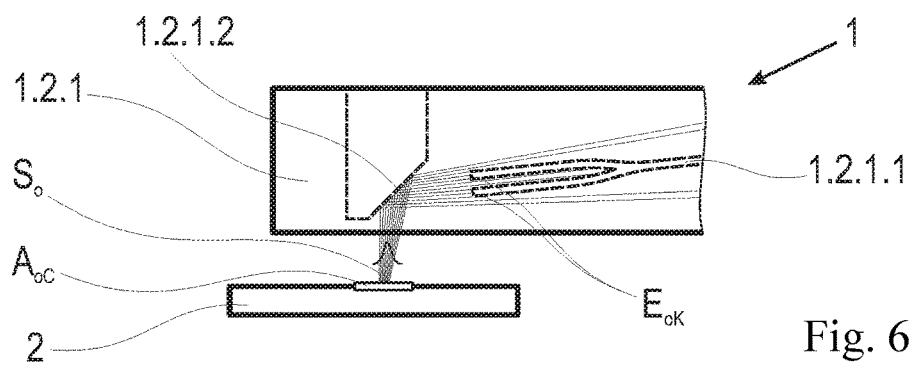

Variant c), in FIG. 6C, uses several waveguides (waveguide group) instead of the taper 5.1, two of which waveguides are shown, arranged at a minimum distance from each other, which are coupled, e.g. by means of junctions created by direct laser writing, and thus also absorb a larger proportion of the signal intensity. The several waveguides are all completely irradiated in every adjustment position.

Figure 6D:
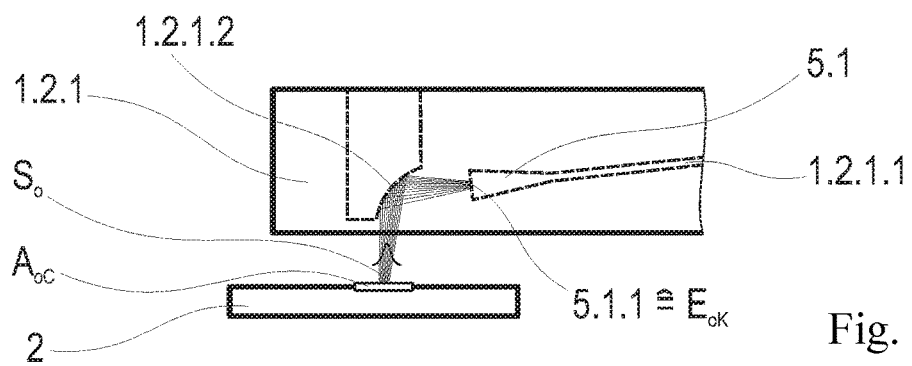

Variant d), in FIG. 6D, uses a concave mirror as the mirror 1.2.1.2, to focus the incident optical signal $S_o$ into the waveguide, and a taper 5.1, as explained for variant b), to fully couple the signal into the waveguide despite a focus position tolerance in each of the adjustment positions.

The variants b)-d) can also be combined with each other.

Figure 7:
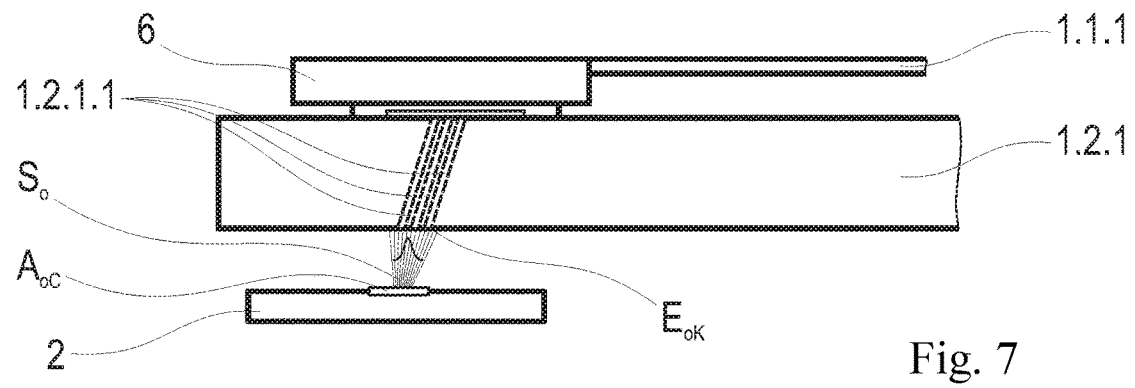
FIG. 7 shows several waveguides arranged upstream of a photodiode in the optical module.

FIG. 7 shows an exemplary embodiment in which an optical signal $S_o$ is coupled, in each of the adjustment positions, into an equal number of waveguides, which either all lead to a photodiode 6 or a photodiode array or (not shown in the drawings) are combined in a waveguide via junctions (Y-junctions).

In a second group of exemplary embodiments, shown in FIG. 8 to FIG. 12, the increase in adjustment insensitivity is achieved by additional beam shaping elements, in this case diffractive optical elements 5.3 or refractive optical elements 5.2 or a combination thereof.

These examples each concern a free beam region between one of the optical outputs $A_{oK}$ on the contacting module 1 and one of the optical inputs $E_{oC}$ of the chip 2.

Figure 8:
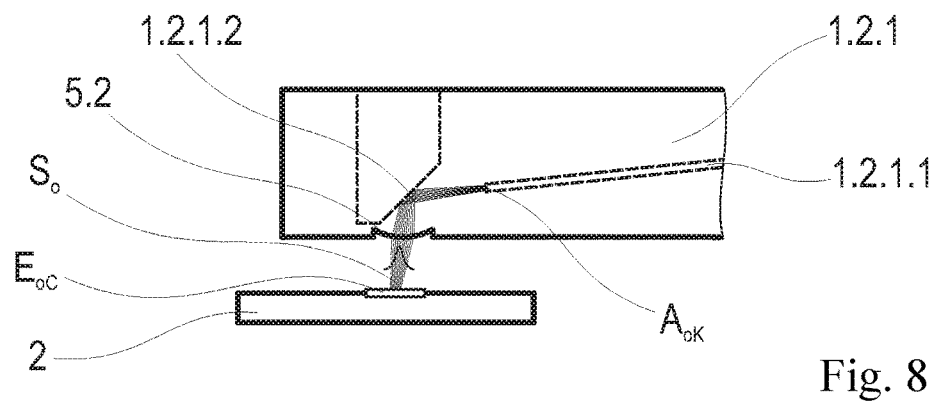
FIGS. 8-12 show different embodiments of optical modules with additional beam shaping elements to influence the optical signal.

FIG. 8 shows an exemplary embodiment using a refractive optical element 5.2 in the form of a microlens formed directly in the substrate of the optical block 1.2.1. To maintain a high adjustment insensitivity, methods such as laser selective etching or laser or stepper-based gray tone lithography are used, allowing a precise alignment of the refractive optical element 5.2 to the waveguides introduced in the substrate, thus ensuring optimal beam shaping without additionally requiring large tolerances.

Alternatively, a diffractive optical element 5.3, not shown here, can be introduced using these methods.

Figure 9:
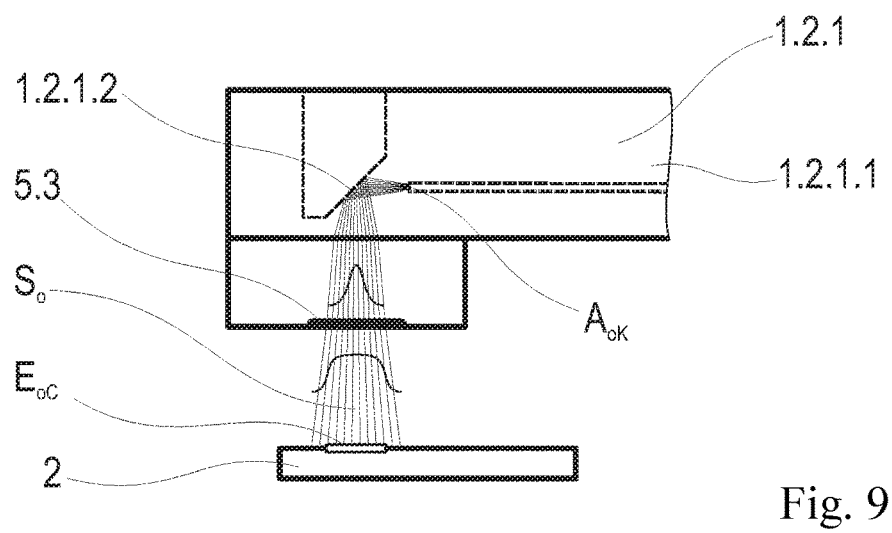

FIG. 9 shows the use of a diffractive optical element 5.3, which combines beam shaping from an intensity distribution over the beam cross-section with a Gaussian profile to a tophat intensity distribution and beam focusing in one element. It is deposited in a separate substrate, preferably of highly refractive material, such as e.g. silicon, on the optical block 1.2.1 with the waveguides.

Figure 10:
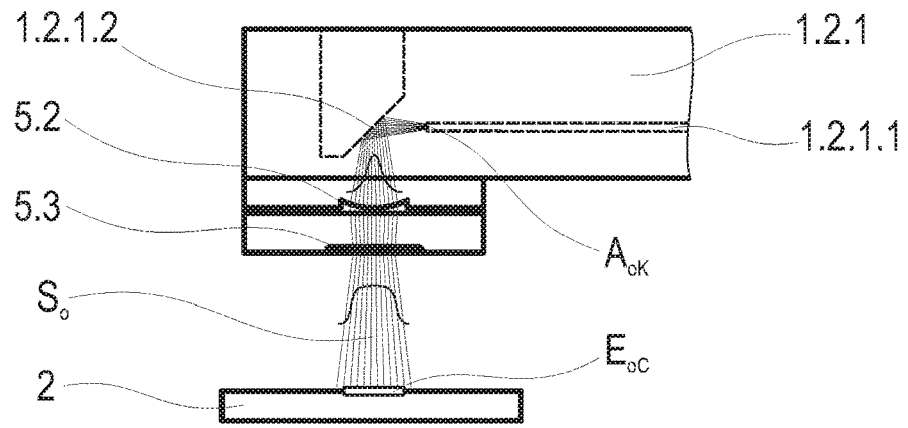

FIG. 10 shows the use of a diffractive optical element 5.3, in a separate substrate, preferably made of highly refractive material, such as silicon, for beam shaping (tophat generation) and separate focusing by means of a microlens in a further substrate made of e.g. glass or also silicon.

Figure 11:
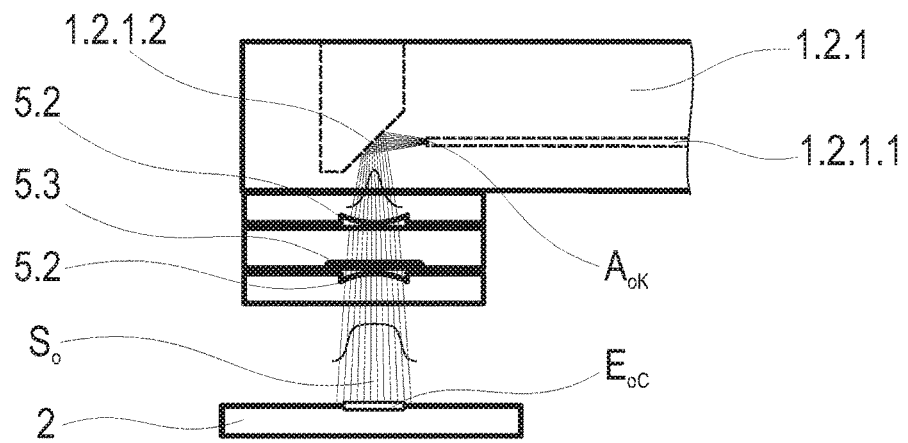

FIG. 11 shows the use of a diffractive optical element 5.3 consisting of a separate substrate (e.g. silicon) for beam shaping (tophat) and two separate microlenses in further separate substrates (e.g. glass) for focusing.

Figure 12:
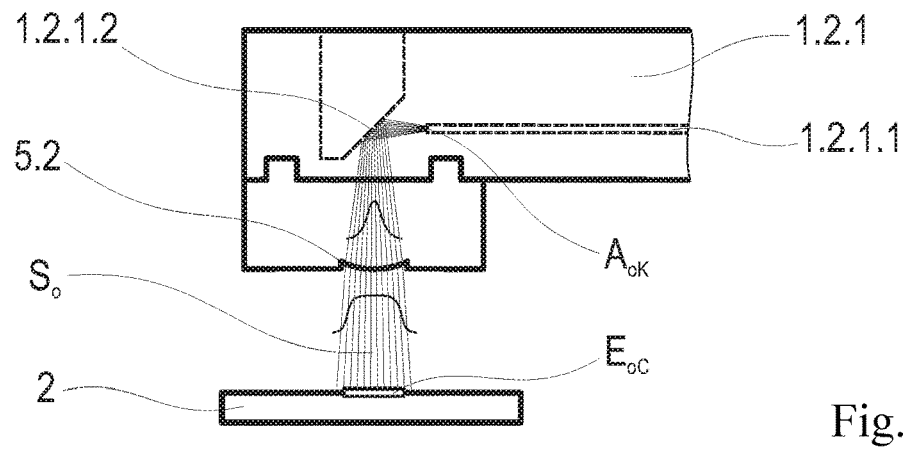

FIG. 12 shows the use of a microlens, which is machined on a separate substrate, e.g. of silicon, for beam shaping. On the separate substrate, mechanical elements are provided for precise passive alignment of the microlens.

Figure 13:
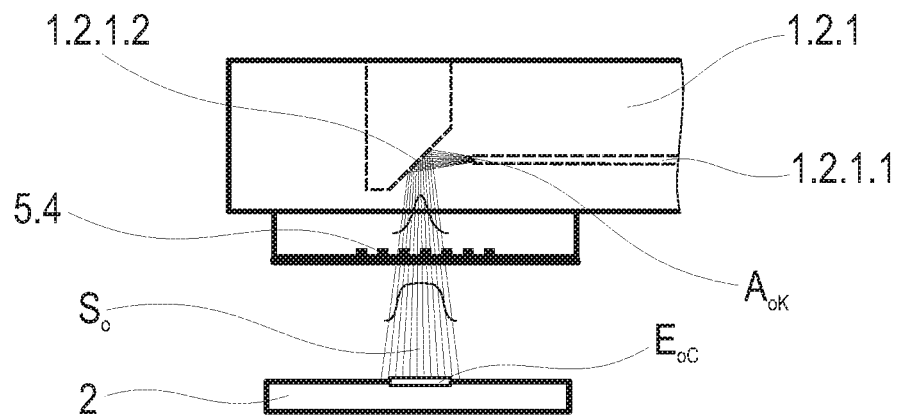
FIG. 13 shows an embodiment of an optical module with a filter for influencing the optical signal.
Figure 14:
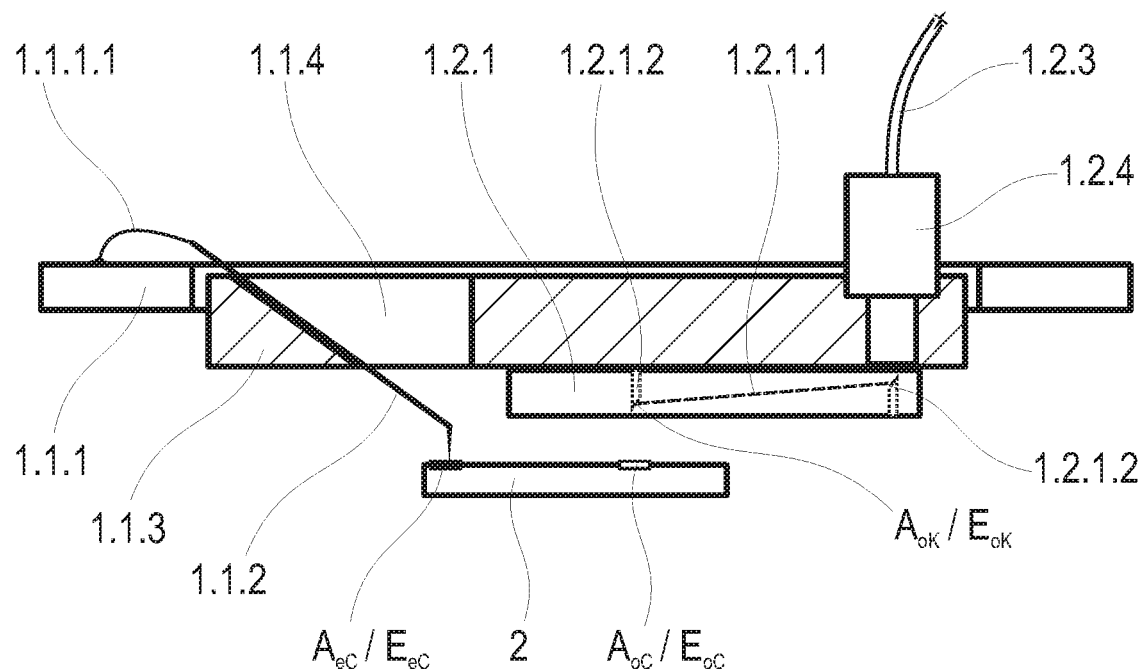
FIG. 14 is a view from above showing the coupling of the optical signals into the optical block.

FIG. 13 shows the use of a filter 5.4, in this case a structured gray scale filter, also called neutral density filter, which is used for beam profile optimization. It influences the intensity distribution over the beam cross-section and thus also constitutes a beam shaping element. What is shown is the generation of a tophat profile from a Gaussian profile. For a high position accuracy with respect to the waveguides and mirrors 1.2.1.2 in the optical block 1.2.1, the structured gray grad filter is preferably applied directly to the optical block 1.2.1 or to a separate element as shown. The layer applied for the gray grad filter absorbs radiation in the IR range and thus homogenizes the intensity distribution within the optical signal $S_o$ over its cross-section. By selecting the coating material and adjusting the coating thickness, the optical density and reflection can be optimized, e.g. to minimize scattered light and thus optical crosstalk in the system.

At all optical interfaces in the beam path, antireflection coatings optimized for the wavelength and the application can be used to increase transmission and minimize back reflections. Preferably, mechanically and chemically stable AR coatings, e.g. using $SiO_2$, are used. This protects the optical block so that cleaning during measurement, which is typical for the electronic module, does not damage the optical module and thus the optical block.

The lateral coupling, as shown in FIGS. 3A-3B, of the optical signals $S_o$ coming from the test apparatus 4, via glass fibers 1.2.3, which are aligned with each other and with the waveguides present in the optical block 1.2.1 in the fiber holder 1.2.2 designed with V-grooves entails limitations. This means that no electrical contact can be made on the side of the chip 2, on which the waveguides are guided laterally outwards to the glass fibers 1.2.3.

The exemplary embodiment shown in FIG. 4 provides only a limited solution to this problem.

A real alternative is the coupling of the optical signals $S_o$ into the optical block 1.2.1 from above instead of from the side. For this purpose, a second mirror 1.2.1.2 is implemented in the optical block 1.2.1 in accordance with FIG. 14 and the optical signal $S_o$ is coupled in from above via a fiber or multi-fiber connector 1.2.4. The fiber or multi-fiber connector 1.2.4 can either be mounted directly on the optical block 1.2.1 (not shown) or on the carrier plate 1.1.3 of the electronic module 1.1.

Figure 15:
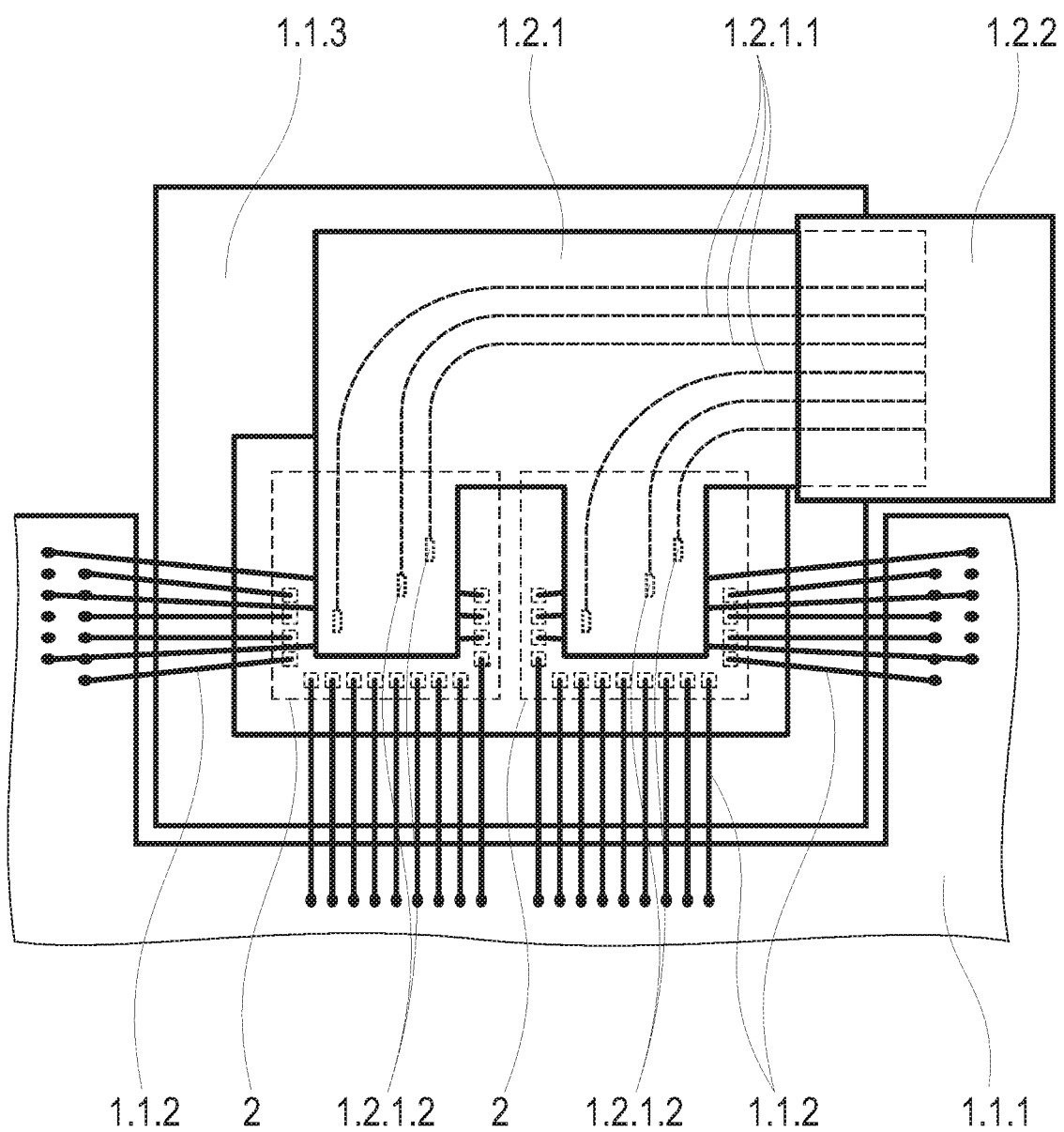
FIG. 15 shows an optical block for contacting two chips.

The exemplary embodiment shown in FIG. 3 for contacting one chip 2 can be extended to parallel contacting of several chips 2 as shown in FIG. 15. This increases the throughput and shortens the measuring time. The decisive factor here is the monolithic integration of all optical interfaces into an optical block 1.2.1 in order to achieve the high positional accuracy of the optical interfaces with respect to each other given by the chosen manufacturing process. While the figure shows the parallel measurement of two chips 2, the configuration can be extended to the parallel measurement of even more chips 2.

Figure 16A:
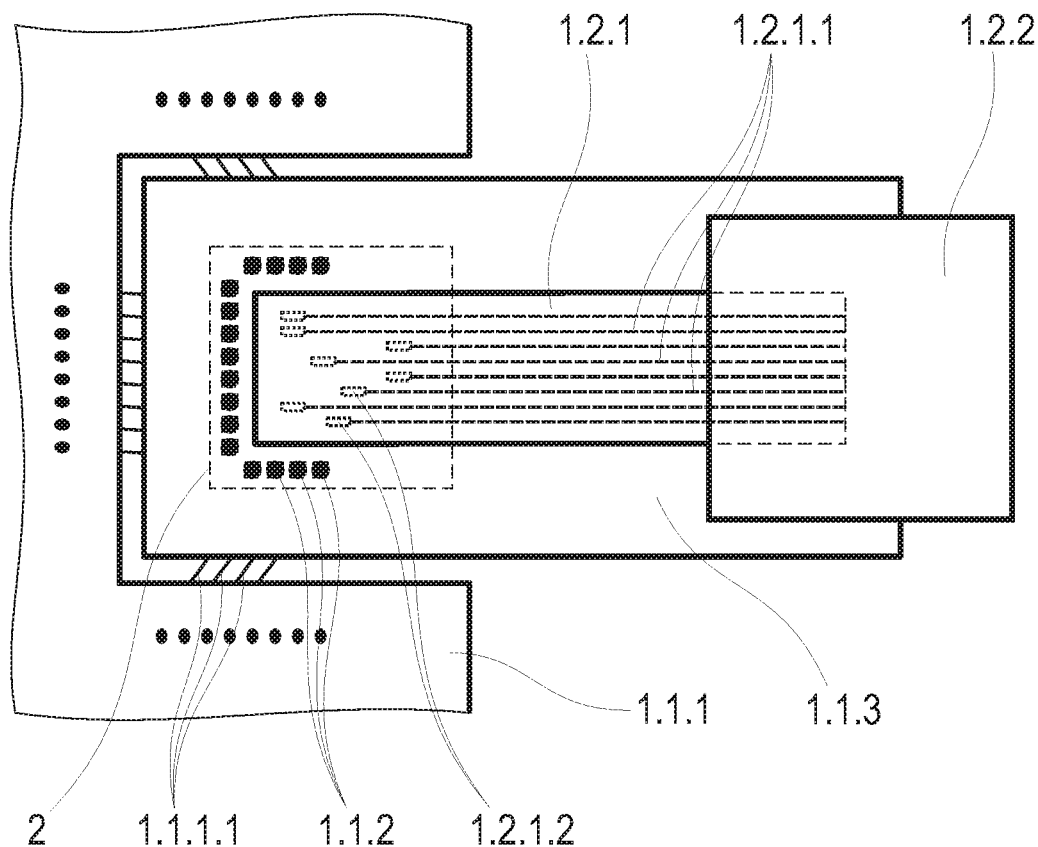
FIGS. 16A-16B show a contacting module with vertical pins.
Figure 16B:
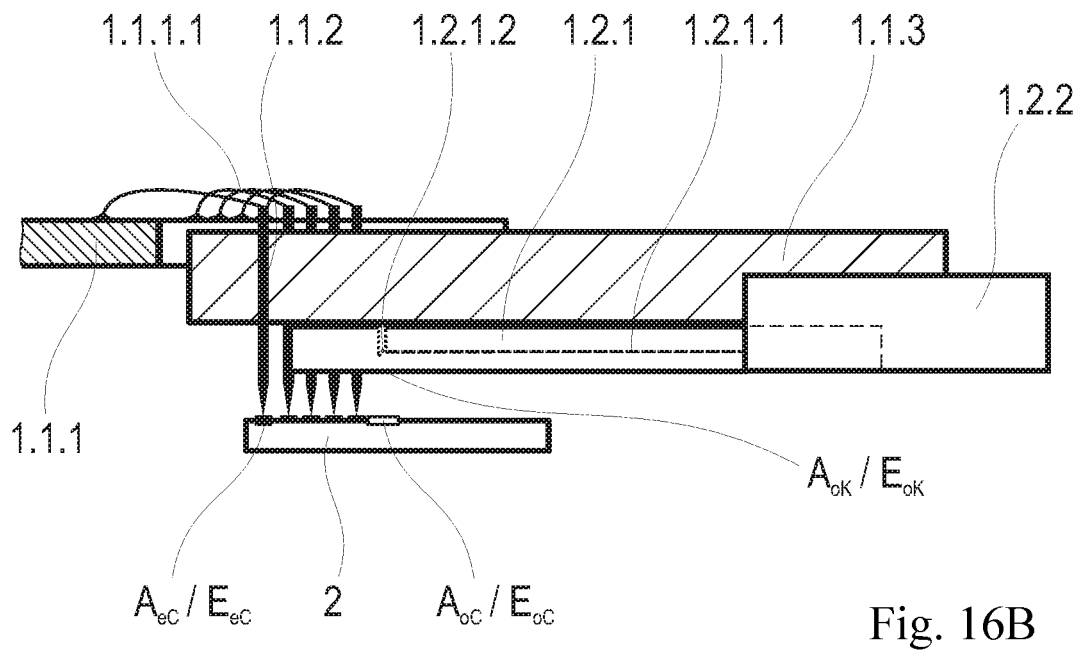

In a modification of the exemplary embodiment shown in FIGS. 3A-3B, in which cantilever pins 1.1.2 are used as contact pins for the electrical contact, vertical pins are used in another exemplary embodiment shown in FIGS. 16A and 16B. The optical block 1.2.1 is mounted on the lower surface of the carrier plate 1.1.3 of the electronic module 1.1. The number and configuration of the vertical pins and mirrors 1.2.1.2 is only shown as an example and can be adapted to different designs of a contacting module 1.

Figure 17:
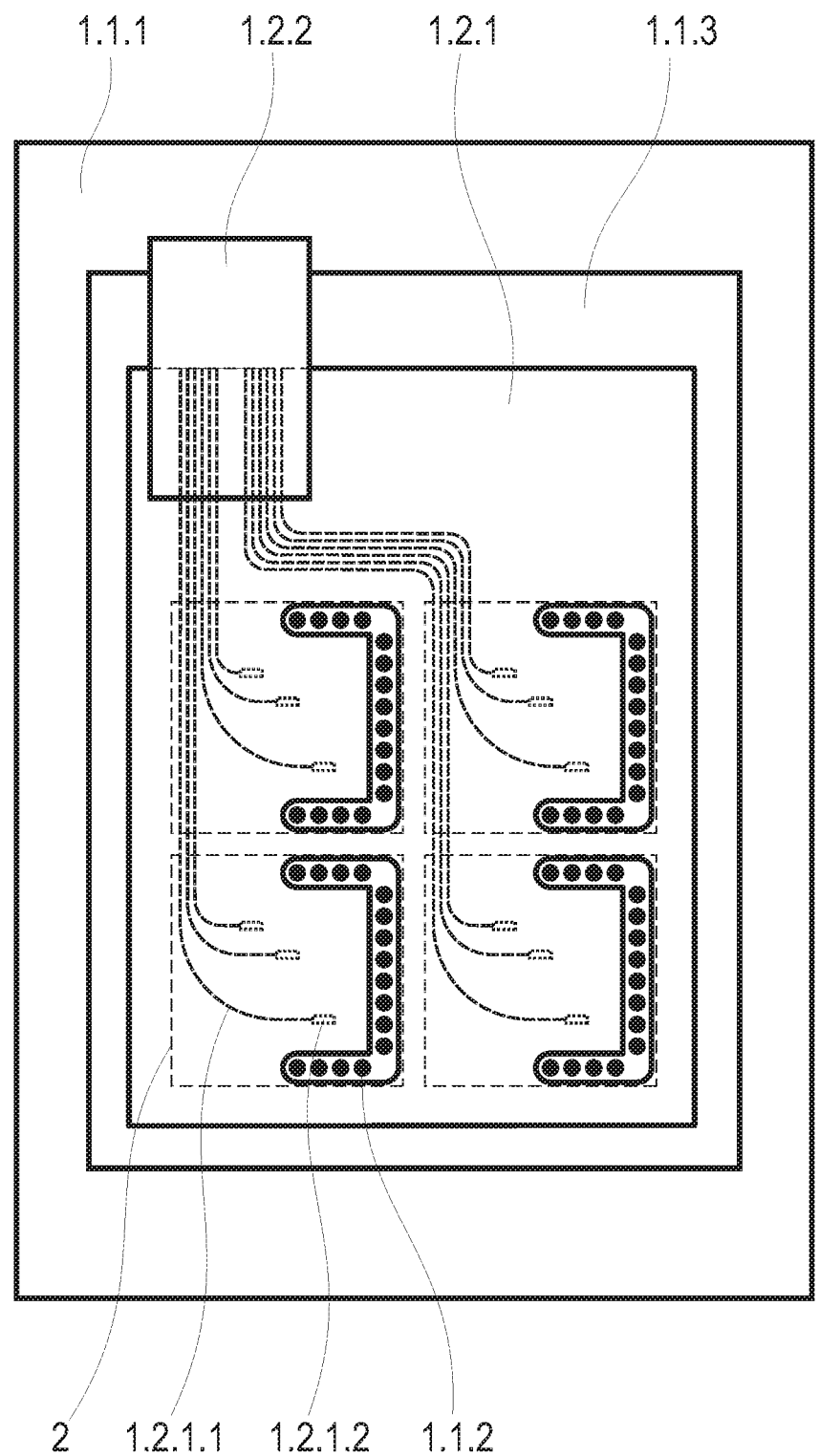
FIG. 17 shows a contacting module for contacting four chips.

A schematic diagram of a contacting module 1 for measuring two times two chips 2 in parallel using an electronic module 1.1 with vertical pins is shown in FIG. 17. The construction and mounting are similar to the exemplary embodiment according to FIGS. 16A and 16B, except that the optical block 1.2.1 contains several openings for the passage of the vertical pins and the routing of the waveguides is adapted accordingly. The exemplary embodiment can be extended to the parallel measurement of more than two times two chips 2.

LIST OF REFERENCE NUMERALS

1 contacting module
1.1 electronical module
1.1.1 printed circuit board
1.1.1.1 electrical signal line
1.1.2 contact pins
1.1.3 carrier plate
1.1.4 ceramic support
1.2 optical module
1.2.1 optical block
1.2.1.1 optical signal lines (in particular waveguides)
1.2.1.2 mirror
1.2.2 fiber holder
1.2.3 glass fiber
1.2.4 fiber connector
2 (optoelectronic) chip
2.1 contact plate
3 wafer platform
4 test apparatus
5.1 taper
5.1.1 entrance opening of the taper 5.1
5.2 refractive optical element
5.3 diffractive optical element
5.4 filter
6 photodiode
6.1 light-sensitive surface
$S_e$ electrical signal
$S_o$ optical signal
$E_{oK}$ optical inputs on the contacting module 1
$A_{oK}$ optical outputs on the contacting module 1
$E_{oC}$ optical inputs of the optoelectronic chip 2
$A_{oC}$ optical outputs of the optoelectronic chip 2
$E_{eK}$ electrical inputs on the contacting module 1
$A_{eK}$ electrical outputs on the contacting module 1
$E_{eC}$ electrical inputs of the optoelectronic chip 2
$A_{eC}$ electrical outputs of the optoelectronic chip 2

What is claimed is:

1. A contacting module for successive contacting optoelectronic chips for transmitting electrical and optical signals ($S_e$, $S_o$) between at least one optoelectronic chip and the contacting module, the module comprising:
   the at least one optoelectronic chip and the contacting module arranged in different adjustment positions relative to one another;
   an electrical module with contact pins and a printed circuit board guiding electrical signal lines;
   an optical module with an optical block guiding the electric and/or optical signal lines, leading to optical inputs and outputs ($E_{oK}$, $A_{oK}$) on the contacting module;
   the electrical and optical signal lines arranged in the contacting module, each of the electrical and optical signal lines having an electrical or optical input or output ($E_{eK}$, $E_{oK}$, $A_{eK}$, $A_{oK}$) on the contacting module and each being assigned to an electrical or optical input or output ($E_{eC}$, $E_{oC}$, $A_{ec}$, $A_{oc}$) of the at least one optoelectronic chip;
   the contact pins forming each of the electrical inputs and outputs ($E_{eK}$, $A_{eK}$) on the contacting module, the contact pins each being in mechanical contact in each of the adjustment positions with one of the electrical inputs or outputs ($E_{eC}$, $A_{eC}$) of the at least one optoelectronic chip for transmitting the electrical signals ($S_e$), which electrical inputs and outputs each are formed by an electrical contact plate; and
   the optical inputs and outputs ($E_{oK}$, $A_{oK}$) on the contacting module and the optical inputs and outputs ($E_{oc}$, $A_{oc}$) of the at least one optoelectronic chip together delimiting, in respective pairs, an optical free beam region for the transmission of the optical signals ($S_o$), wherein:
   the optical signals ($S_o$) transmitted from the contacting module to the at least one optoelectronic chip irradiate the optical inputs ($E_{oC}$) of the at least one optoelectronic chip in each of the adjustment positions;
   the optical signals ($S_o$) each illuminate an area of one of the optical inputs ($E_{oC}$) on the at least one chip larger than the opening of the respective optical input ($E_{oC}$) of the at least one chip, so that in each of the adjustment positions the optical inputs ($E_{oC}$) of the at least one chip are irradiated;
   the printed circuit board and the optical block are fixedly arranged in a mutually adjusted manner, and
   the optical signal lines are waveguides integrated in the optical block.

2. The contacting module according to claim 1, wherein the printed circuit board and the optical block are made of different materials and the electrical and optical signal lines are manufactured independently of each other.

3. The contacting module according to claim 1, wherein an intensity distribution in the beam cross-section of the optical signal ($S_o$) corresponds to a Gaussian distribution.

4. The contacting module according to claim 1, wherein e intensity distribution in the beam cross-section of the optical signal ($S_o$) corresponds to a top-hat distribution.

5. The contacting module according to claim 1, wherein the optical block is embodied in such a way that all contact pins present on the electronic module are in contact with the chip past the optical block, around it and/or through openings formed therein.

6. The contacting module according to claim 1, wherein there is at least one beam shaping element in the free beam region by which the optical signal ($S_o$) is shaped geometrically and/or in its intensity distribution.

7. The contacting module according to claim 6, wherein the at least one beam shaping element is a structured gray grad filter that homogenizes the intensity distribution of the optical signal ($S_o$).

8. The contacting module according to claim 1, wherein the inputs or outputs of the waveguides forming the optical inputs or outputs ($E_{oK}$, $A_{oK}$) on the contacting module are located inside the optical block, and wherein each of the inputs or outputs ($E_{oK}$, $A_{oK}$) is preceded by an integrated mirror which deflects the optical signals ($S_o$) coming from the waveguide in a direction for coupling into the at least one chip.

9. The contacting module according to claim 8, wherein the mirror is designed as a concave mirror.

10. The contacting module according to claim 1, wherein the optical signals ($S_o$) transmitted by the at least one optoelectronic chip are completely coupled into the optical inputs ($E_{oK}$) on the contacting module in each of the adjustment positions.

11. The contacting module according to claim 10, wherein each of the waveguides ends in a taper, having a cross-section adapted to a waveguide cross-section at an entrance of each of the waveguide and directs the entire radiation intensity of the optical signal ($S_o$) into the waveguide in each of the adjustment positions, the beam cross-section of the optical signal ($S_o$) incident into the taper being smaller than an entrance opening of the taper.

12. The contacting module according to claim 10, wherein each of the waveguides ends in an upstream waveguide group having the group's ends together form one of the optical inputs ($E_{oK}$), which is completely irradiated in each adjustment position, so that a proportion of the signal intensity coupled in the upstream waveguide group is larger than that in one waveguide.

* * * * *